(12) United States Patent
Lau et al.

(10) Patent No.: US 10,475,763 B2
(45) Date of Patent: Nov. 12, 2019

(54) DIE BONDING APPARATUS COMPRISING AN INERT GAS ENVIRONMENT

(71) Applicant: ASM Technology Singapore Pte Ltd, Singapore (SG)

(72) Inventors: Siu Wing Lau, Kwai Chung (HK); Kin Yik Hung, Kwai Chung (HK); Yuk Cheung Au, Kwai Chung (HK); Wing Chiu Lai, Kwai Chung (HK); Leo Man Lee, Kwai Chung (HK); Sai Yuen Go, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 360 days.

(21) Appl. No.: 15/160,814

(22) Filed: May 20, 2016

(65) Prior Publication Data

US 2016/0351527 A1    Dec. 1, 2016

Related U.S. Application Data (60) Provisional application No. 62/166,251, filed on May 26, 2015.

(51) Int. Cl.
*H01L 21/67*    (2006.01)
*H01L 23/00*    (2006.01)
*H01L 21/677*   (2006.01)

(52) U.S. Cl.
CPC ........ *H01L 24/75* (2013.01); *H01L 21/67742* (2013.01); *H01L 2224/759* (2013.01);
(Continued)

(58) Field of Classification Search
CPC ..... H01L 2224/81203; H01L 2224/751; H01L 2224/75101; H01L 2224/81075;
(Continued)

(56) References Cited

U.S. PATENT DOCUMENTS

| | | | | |
|---|---|---|---|---|
| 4,767,047 A | * | 8/1988 | Todd | B23K 1/012 228/191 |
| 4,899,920 A | * | 2/1990 | Abbagnaro | H05K 13/0465 228/11 |

(Continued)

FOREIGN PATENT DOCUMENTS

| EP | 3 098 837 A3 | 2/2017 |
|---|---|---|
| JP | S61-70729 A | 4/1986 |

(Continued)

OTHER PUBLICATIONS

European Search Report, dated Sep. 27, 2016, issued in corresponding European Patent Application No. EP16001177.1. Total 17 pages.

(Continued)

*Primary Examiner* — Erin B Saad
*Assistant Examiner* — Carlos J Gamino
(74) *Attorney, Agent, or Firm* — Ostrolenk Faber LLP (57) ABSTRACT

A die bonding apparatus comprising a first inert gas container having a first inert gas concentration, and a second inert gas container having a second inert gas concentration enclosed within the first inert gas container. The second inert gas concentration is higher than the first inert gas concentration. The die bonding apparatus further comprises a bond head located in the second inert gas container for receiving a die for bonding, and a third inert gas container having an inert gas environment that is separate from the first and second inert gas containers and where a substrate is locatable for die bonding. The bond head is operative to move the die between a first position within the second inert container and a second position within the third inert gas container to bond the die onto the substrate located in the third inert gas container.

16 Claims, 8 Drawing Sheets

(52) U.S. Cl.
CPC ............ *H01L 2224/7565* (2013.01); *H01L 2224/75101* (2013.01); *H01L 2224/75821* (2013.01); *H01L 2224/75841* (2013.01)

(58) Field of Classification Search
CPC ..... H01L 2224/81093; H01L 21/67742; H01L 2224/75251; H01L 2224/75252; H01L 2224/7565; H01L 2224/75804; H01L 2224/75821; H01L 2224/75824; H01L 2224/75841; H01L 24/75; H01L 24/81; H01L 21/67144; B23K 20/023
See application file for complete search history.

(56) References Cited

U.S. PATENT DOCUMENTS

| | | | | |
|---|---|---|---|---|
| 4,984,731 A | * | 1/1991 | Imamura | H01L 21/67144 228/102 |
| 5,205,461 A | * | 4/1993 | Bickford | B23K 1/012 228/119 |
| 5,232,144 A | * | 8/1993 | Carney | B23K 3/0315 228/219 |
| 5,433,371 A | * | 7/1995 | Morisako | B23K 20/004 228/180.5 |
| 5,538,176 A | * | 7/1996 | Hasegawa | B23K 35/0244 228/180.5 |
| 5,560,531 A | * | 10/1996 | Ruszowski | B23K 1/008 228/19 |
| 5,667,129 A | * | 9/1997 | Morita | H05K 13/0413 228/102 |
| 5,735,450 A | * | 4/1998 | Heim | B23K 1/012 228/191 |
| 5,975,409 A | * | 11/1999 | Brofman | H01L 24/75 228/180.22 |
| 6,102,273 A | * | 8/2000 | Satoh | B23K 1/0008 228/102 |
| 6,257,478 B1 | * | 7/2001 | Straub | B23K 1/018 228/119 |
| 6,347,734 B1 | * | 2/2002 | Downes | B23K 1/0016 228/180.21 |
| 6,499,644 B2 | * | 12/2002 | Cox | B23K 1/018 228/19 |
| 6,866,182 B2 | * | 3/2005 | Wong | B23K 20/005 228/180.5 |
| 7,093,744 B2 | * | 8/2006 | Seki | B23K 20/004 228/103 |
| 7,182,793 B2 | * | 2/2007 | Duan | B23K 20/007 228/42 |
| 7,428,979 B2 | * | 9/2008 | Glever | B23K 1/012 228/232 |
| 7,784,670 B2 | * | 8/2010 | Suga | B23K 20/023 228/116 |
| 7,975,901 B2 | * | 7/2011 | Maeda | B23K 20/007 134/1.2 |
| 2003/0164396 A1 | * | 9/2003 | Suga | B23K 1/206 228/219 |
| 2004/0169020 A1 | * | 9/2004 | Yamauchi | H01L 21/4864 219/121.46 |
| 2006/0054283 A1 | * | 3/2006 | Yamauchi | H01L 24/75 156/580 |
| 2006/0273450 A1 | * | 12/2006 | Shi | B23K 20/023 257/706 |
| 2009/0145546 A1 | * | 6/2009 | Inamoto | H01L 24/75 156/272.6 |
| 2009/0272721 A1 | | 11/2009 | Ohmi | 219/118 |
| 2011/0121055 A1 | * | 5/2011 | Kajii | B23K 20/023 228/49.5 |
| 2012/0199636 A1 | * | 8/2012 | Patrick | B23K 9/325 228/218 |
| 2013/0153645 A1 | * | 6/2013 | Owens | H01L 25/50 228/180.22 |
| 2017/0016954 A1 | * | 1/2017 | Kalnin | G01R 1/0466 |

FOREIGN PATENT DOCUMENTS

| | | | | |
|---|---|---|---|---|
| JP | 2002-050656 A | | 2/2002 | |
| JP | 2002-64268 A | | 2/2002 | |
| JP | 2005086142 A | * | 3/2005 | ............ H01L 24/78 |
| JP | 2005-285959 A | | 10/2005 | |
| JP | 2006-332523 A | | 12/2006 | |
| JP | 2008-4722 A | | 1/2008 | |
| WO | WO 2007/036991 A1 | | 4/2007 | |

OTHER PUBLICATIONS

Japanese Notice of Allowance, dated Dec. 4, 2017, issued in corresponding Japanese Patent Application No. 2016-104035. English translation. Total 5 pages.

* cited by examiner

DIE BONDING APPARATUS COMPRISING AN INERT GAS ENVIRONMENT

FIELD OF THE INVENTION

The invention relates to a die bonding apparatus, and in particular to a die bonding apparatus comprising an inert gas environment to conduct die bonding.

BACKGROUND

Assembly of an integrated circuit (IC) when manufacturing an electronic package involves attaching a die or chip to a substrate. One example of a bonding process is the thermal compression bonding (TCB) process, which may be used for flip-chip bonding. The TCB process is not a batch process, unlike a conventional oven reflow process. The bonding of a flip-chip die during a TCB process is performed one die at a time. The die from the silicon wafer is flipped and transferred to a bond-arm with bumps on the die facing down. The die carried by the bond-arm is then placed onto a bonding location of the substrate or onto another die. A small compressive force is applied onto the die to press it against the substrate or the other die to ensure good contact between the die and the substrate or between the respective dice.

Impurities on bonding materials are undesirable because impurities prevent good contact between the bonding materials and bonding surfaces, which may result in performance degradation of final products. There are many potential sources of impurities in a die bonding process. For example, impurities may originate from foreign materials covering the surface of the bonding materials, arise from oxidation of the bonding materials under high temperature during the TCB process, or result from by-products generated during the bonding process.

It would be beneficial to reduce the amount of impurities which may interfere with the bonding process to avoid performance degradation of assembled electronic packages.

SUMMARY OF THE INVENTION

It is thus an object of this invention to seek to provide a die bonding apparatus which is able to reduce the amount of impurities in order to avoid performance degradation of assembled electronic packages.

According to the invention, there is provided a die bonding apparatus comprising a first inert gas container having a first inert gas concentration; a second inert gas container having a second inert gas concentration enclosed within the first inert gas container, the second inert gas concentration being higher than the first inert gas concentration; a bond head located in the second inert gas container for receiving a die for bonding; and a third inert gas container having an inert gas environment that is separate from the first and second inert gas containers and where a substrate is locatable for die bonding. The bond head is operative to move the die between a first position within the second inert container and a second position within the third inert gas container to bond the die onto the substrate located in the third inert gas container.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Figure 1:
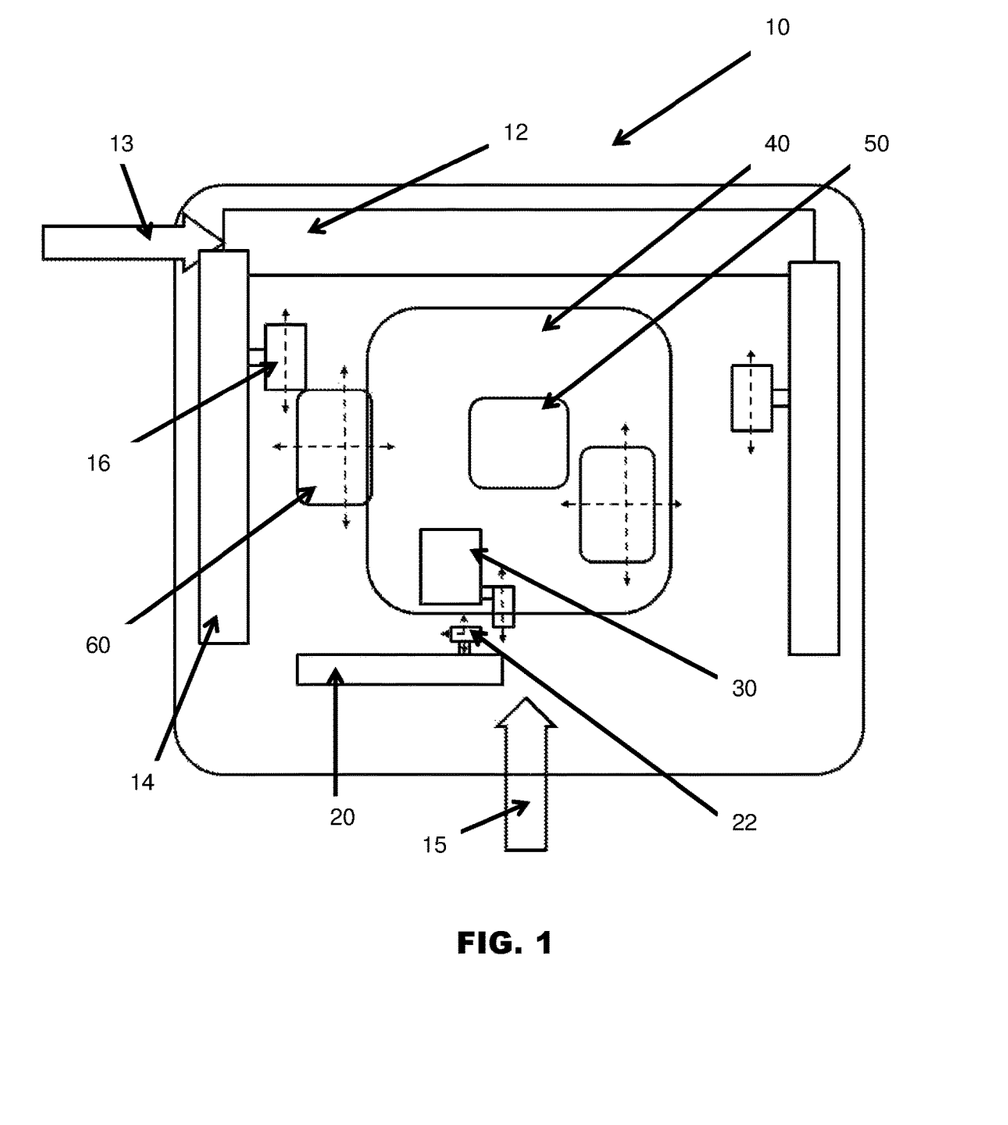
FIG. 1 is a plan view of a die bonder according to the preferred embodiment of the present invention.

FIG. 1 is a plan view of a die bonder 10 according to the preferred embodiment of the present invention. The die bonder 10 comprises a transfer system, such as a highway transfer system 12 which is configured to transport a bonding substrate or die package to a location where a substrate transfer arm (STA) head 16 of a substrate transfer arm (STA) 14 is operative to pick up the substrate. The substrate is supplied to the highway transfer system 12 from a substrate supply 13. The STA 14, which is movable in an X axis, is configured to transport the substrate and place it onto a bond stage 60 at a loading position. The bond stage 60, which is movable along X-Y axes, is movable below a first inert gas container or macro inert environment 40. The macro inert environment 40 has a first inert gas concentration. The macro inert environment 40 comprises a second inert gas container or core inert environment 50 which has a second inert gas concentration. The second inert gas concentration has a higher concentration of inert gas than the first inert gas concentration. In other words, the core inert environment 50, which is located within the macro inert environment 40, has a lower oxygen concentration than the macro inert environment 40. The bond stage is locatable below the macro inert environment 40 and the core inert environment 50. The bond stage 60 is configured to transport the substrate from the loading position where the substrate is loaded onto the bond stage 60, to a bonding position below the core inert environment 50 where die bonding is performed. A cleaning system (not shown) may be used to clean the substrate before the bond stage 60 moves the substrate below the macro inert environment 40.

A die pick arm (DPA) head 22 of a die pick arm (DPA) 20 is configured to pick up a die from a semiconductor dice supply 15. The DPA 20 is configured to transport the die to a die transporter or die transfer arm (DTA) 30 located within the macro inert environment 40. The DTA 30 is configured to transport the die to a pick-up position within the macro inert environment 40 to be picked up by the bond head 52. The transportation of the substrate and the die to the bonding position may be performed simultaneously.

Figure 2:
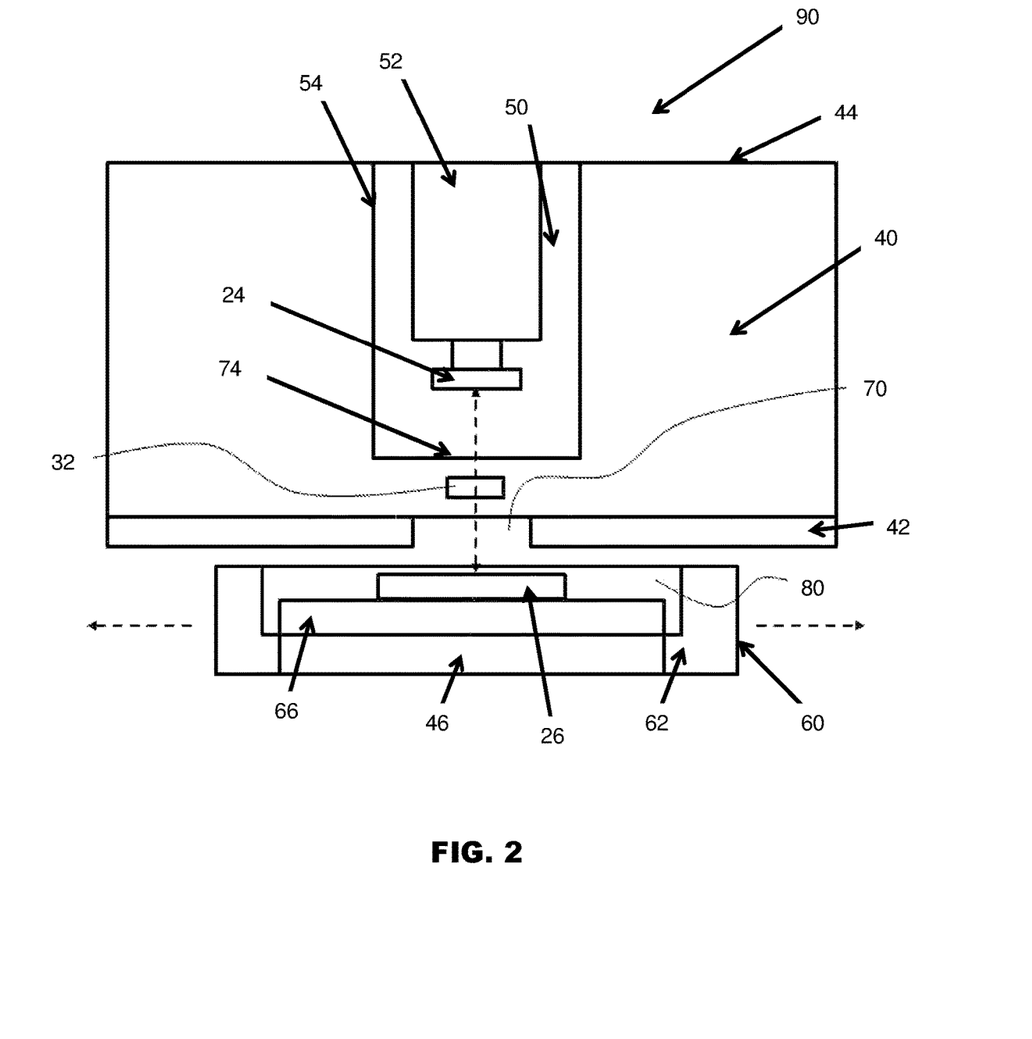
FIG. 2 is a side view of an inert environment system for performing die bonding.

FIG. 2 is a side view of an inert environment system 90 for performing die bonding. In particular, the inert environment system 90 protects a die 24 and a substrate 26 from impurities and oxidation, especially when the temperatures of the die 24 and the substrate 26 are high, for example before, during, and after bonding. The inert environment system 90 comprises the macro inert environment 40, the core inert environment 50 within the macro inert environment 40, and a third inert gas container or micro inert environment 80 located below the macro inert environment 40. The micro inert environment 80 has an inert gas environment that is separate from the macro inert environment 40 and the core inert environment 50. The micro inert environment 80 is mounted on the bond stage 60, where the substrate 26 is locatable for die bonding.

The macro inert environment 40 comprises a macro inert chamber 44, and a macro inert chamber base plate 42 covering the bottom of the macro inert chamber 44. The macro inert chamber 44 further comprises a DTA opening 32 on a side wall of the macro inert chamber 44. The DTA opening 32 is configured to allow the DPA 20 to transfer the die 24 to the DTA 30. The macro inert chamber base plate 42 comprises a first container opening or bond exhaust window (BEW) opening 70 located generally at a centre of the macro inert chamber base plate 42. The core inert environment 50 comprises a second container opening 74 aligned to the BEW opening 70 and the pick-up position, such that the bond head 52 is able to move to the pick-up position in the macro inert environment 40 to pick up the die 24 from the DTA 30. The second container opening 74 and the BEW opening 70 are also aligned to the bonding position, such that the bond head 52 is able to move to the bonding position to bond the die 24 to the substrate 26. The BEW opening 70 and the second container opening 74 fluidly connect the macro inert environment 40, the core inert environment 50, and the micro inert environment 80. The macro inert environment 40 provides a low-oxygen inert environment to protect the die 24, which usually has not yet been heated for bonding while moving the die 24 to the pick-up position. The macro inert environment 40 does not have a direct inert gas supply, but is generally passively filled with inert gas which overflows from the core inert environment 50 and/or the micro inert environment 80. The macro inert environment 40 may further include inspection optics to perform pre-bonding and/or post-bonding inspection.

The core inert environment 50 comprises a core inert chamber 54 with the second container opening 74 at the bottom thereof. A bond head 52 is located within the core inert environment 50. The core inert environment 50 is located generally above the BEW opening 70. The bond head 52 is operative to move the die 24 from a first position within the core inert environment 50 to a second position within the micro inert environment 80 in order to bond the die 24 onto the substrate 26 located within the micro inert environment 80. The DTA 30 is configured to transport the die 24 to below the bond head 52, in order for the bond head 52 to pick up the die 24. The bond head comprises a bond head heater (not shown) for heating the die 24 to a bonding temperature. A high concentration of an inert gas, for example nitrogen, is continuously supplied into the core inert environment 50 to keep the concentration of oxygen as low as possible, in order to protect the die 24 from oxidation when it is heated by the bond head 52.

The bond stage 60 comprises a bond stage heater 46, a bond stage pedestal 66 located on the bond stage heater 46, and walls 62 along the periphery of the bond stage 60. The bond stage pedestal 66 is configured to hold the substrate 26, and the bond stage heater 46 is configured to heat the substrate 26 for bonding. The micro inert environment 80 is formed when the bond stage 60 moves below the macro inert environment 40. The micro inert environment 80 primarily comprises a portion of the bond stage 60 that is enclosed by the walls 62 on the sides, by the bond stage pedestal 66 on the bottom, and by the macro inert chamber base plate 42 on the top. There is a gap between the walls 62 and the macro inert chamber base plate 42, which allows the micro inert environment 80 to freely move around below the macro inert environment 40. The micro inert environment 80 provides a low-oxygen inert environment to protect the substrate 26 when it is heated up by the bond stage heater 46, for example when transporting the substrate 26 to the bonding position below the core inert environment 50. When the micro inert environment 80 is below the core inert environment 50, some of the inert gas flows from the core inert environment 50 to the micro inert environment 80, thus providing a supply of inert gas to the micro inert environment 80.

Figure 3:
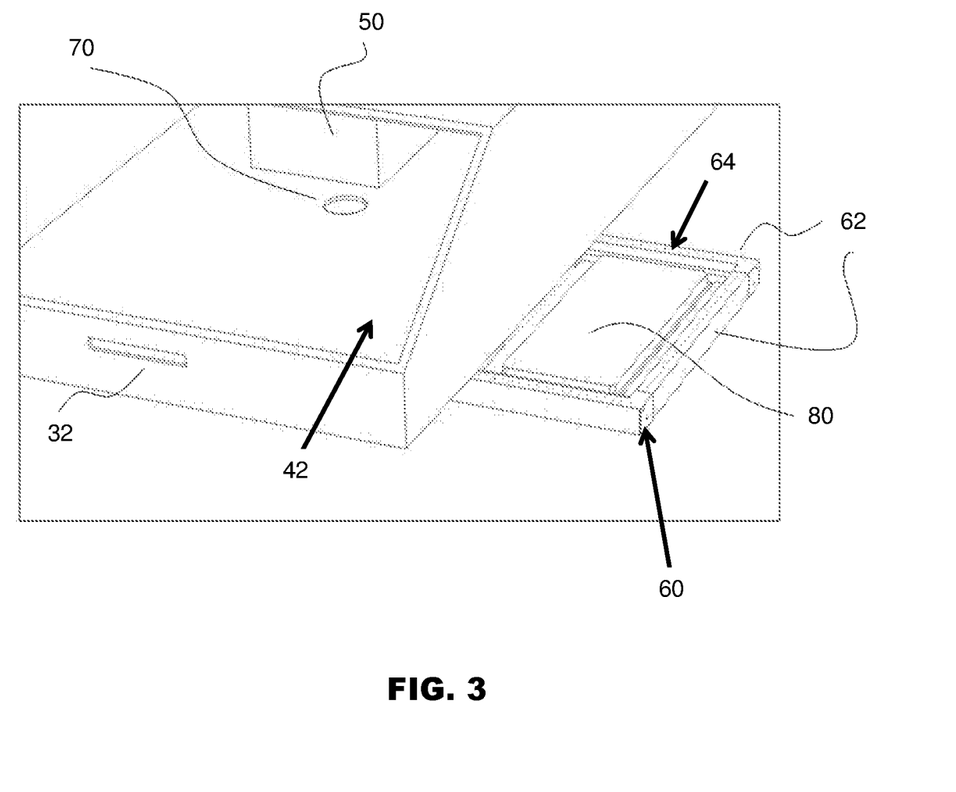
FIG. 3 is a perspective view of part of the inert environment system including a movable bond stage for receiving a substrate to be processed.

FIG. 3 is a perspective view of part of the inert environment system 90 of FIG. 2, including a movable bond stage 60 for receiving a substrate 26 to be processed. The movable bond stage 60 comprises an XY table. The walls 62 comprise bond stage inert gas outlets 64 which surround or enclose the sides of the micro inert environment 80 in a manifold structure. The DTA opening 32 is configured to allow the DPA 20 to transfer the die 24 to the DTA 30. The DPA 20 is operative to extend through the d DTA opening 32 to transfer the die to the DTA 30. The transfer of the die 24 by the DPA 20 into the macro inert environment 40 is usually performed as fast as possible to reduce the time the die 24 is exposed to ambient air, in order to minimize oxidation of the die 24. In order to minimize gaseous exchange between the macro inert environment 40 and the ambient air, a door (not shown) may be provided at the DTA opening 32. The door may comprise a mechanical shutter door, which opens only when the DPA 20 is transferring the die 24 to the DTA 30, and which remains closed at other times.

Figure 4:
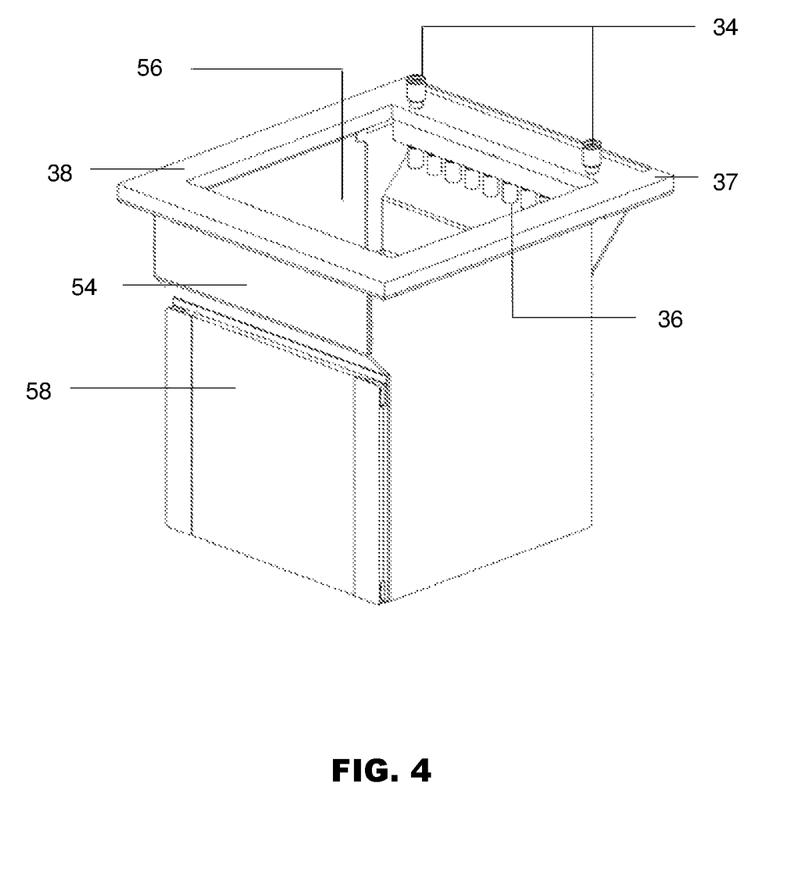
FIG. 4 is a perspective view of a core inert environment comprised in the inert environment system.

FIG. 4 is a perspective view of the core inert environment 50 comprised in the inert environment system 90. The core inert chamber 54 may include a transparent window 58 at a side wall, in order to allow a user to look into the core inert environment 50. The core inert environment 50 comprises a high concentration of inert gas and a low concentration of oxygen, for preventing oxidation when the die 24 is heated by the bond head 52 to a high temperature where oxidation occurs more readily. Inert gas is actively and directly supplied to the core inert environment 50 to maintain the high concentration of inert gas and low concentration of oxygen. The core inert chamber 54 comprises inert gas inlets 34 for supplying inert gas to the core inert environment 50, a plurality of inert gas outlets or diffusers 36 connected to the inert gas inlets 34, and a flow channel plate 38 for delivering inert gas from the inert gas inlets 34 to the diffusers 36. The flow channel plate 38, which covers the top of the core inert chamber 54, comprises four peripheral side walls which define a bond head opening 56 for locating the bond head 52. A gasket layer 37 is placed on a top surface of the flow channel plate 38. The diffusers 36 are located alongside two opposite peripheral side walls of the flow channel plate 38.

Figure 5:
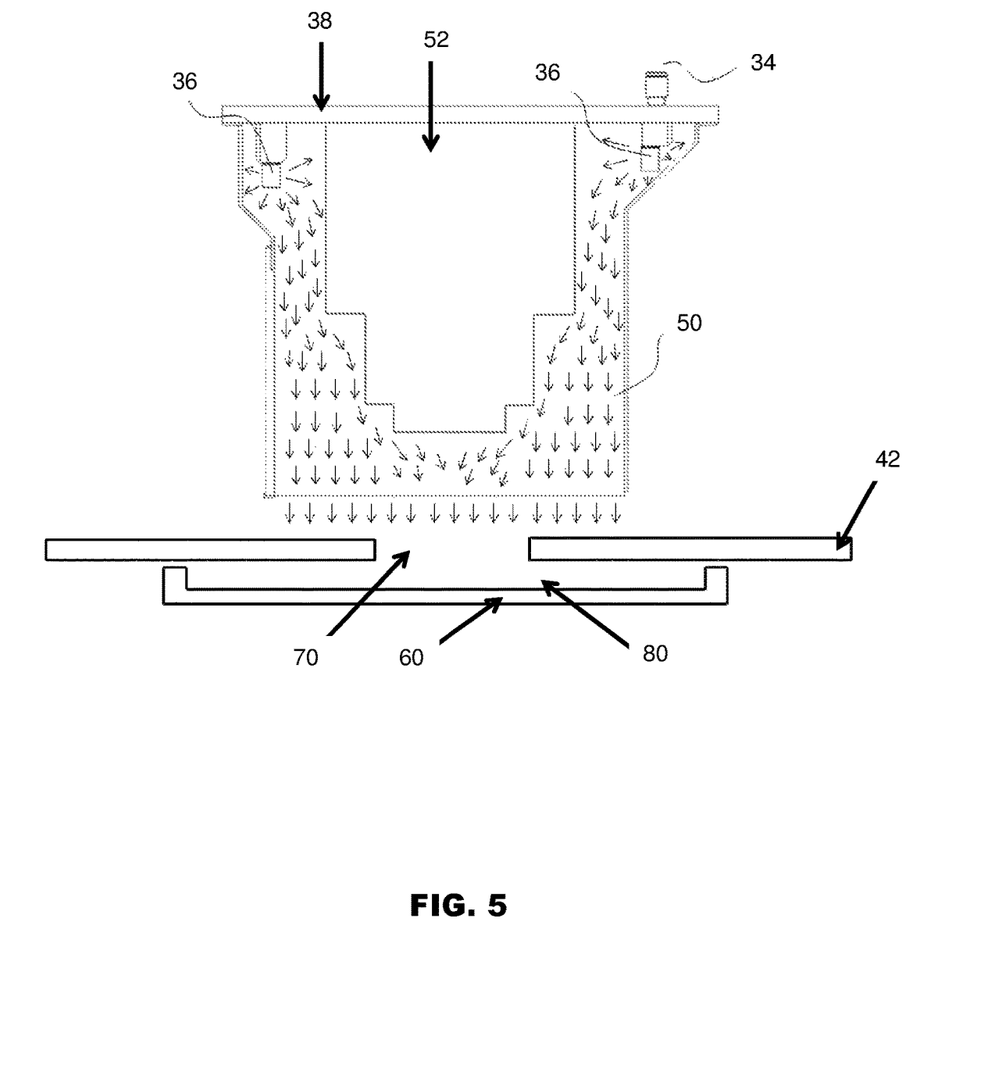
FIG. 5 is a sectional view of an exemplary gas-flow comprised in the core inert environment.

FIG. 5 is a sectional view of an exemplary gas-flow comprised in the core inert environment 50. An inert gas supply (not shown) is connected to the core inert environment 50 via the inert gas inlets 34 to supply inert gas to the core inert environment 50. Inert gas flows in from the inert gas inlets 34 to the flow channel plate 38, and then to the diffusers 36. The diffusers 36, which are spaced equally apart, evenly distribute the inert gas into the core inert environment 50. The diffusers 36 direct a laminar downward inert gas flow around the bond head 52 and the die 24 and towards the second container opening 74 at the bottom of the core inert environment 50. The diffusers 36 may be configured to slow down the flow speed of the inert gas, in order to better create the laminar downward flow as well as a uniform concentration of inert gas within the core inert environment 50. In this way, a suitable environment is created for bonding and to protect the heated die 24 from oxidation.

The core inert environment 50 is directly above the BEW opening 70 of the macro inert chamber base plate 42. When the micro inert environment 80 is positioned to the bonding position, the micro inert environment 80 is directly below the core inert environment 50 and the BEW opening 70. The inert gas from the diffusers 36 fills up the core inert environment 50, and flows downwards towards the BEW opening 70.

Figure 6:
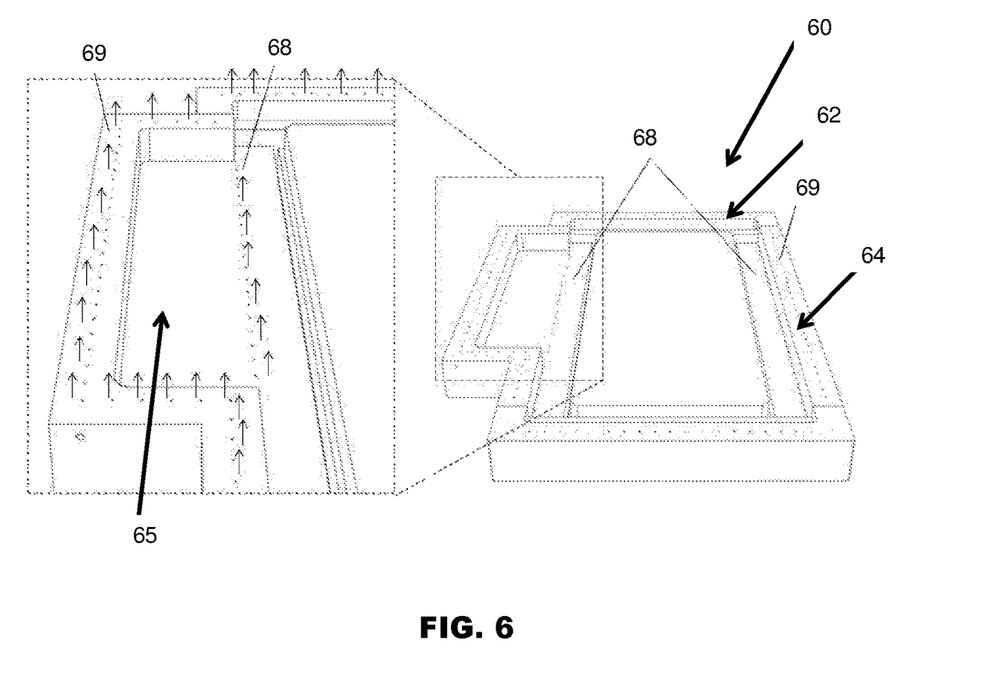
FIG. 6 is a perspective view of the bond stage illustrating an air-flow generated therefrom.

FIG. 6 shows a perspective view of the bond stage 60 illustrating an air-flow generated therefrom. The bond stage 60 comprises the walls 62 which comprise the bond stage inert gas outlets 64 surrounding the micro inert environment 80 in a manifold structure. The bond stage inert gas outlets 64 comprises outer inert gas outlets 69, which direct inert gas upwards, thereby forming a shield or air curtain above the bond stage inert gas outlets 64. The bond stage 60 also comprises inner micro inert chamber gas outlets 68 which supply inert gas into the micro inert environment 80. The bond stage 60 further comprises an additional storage space 65 between one of the walls 62 and the position where the substrate 26 is locatable for die bonding. The additional storage space 65 may, for example, be used as a nozzle bank to store different nozzles for picking up different dice. The bond head 52 may change to a different nozzle which is mountable onto the bond head 52 anytime during the bonding process, while the bond head 52 and the nozzles are being protected by the core inert environment 50 and the micro inert environment 80.

Figure 7:
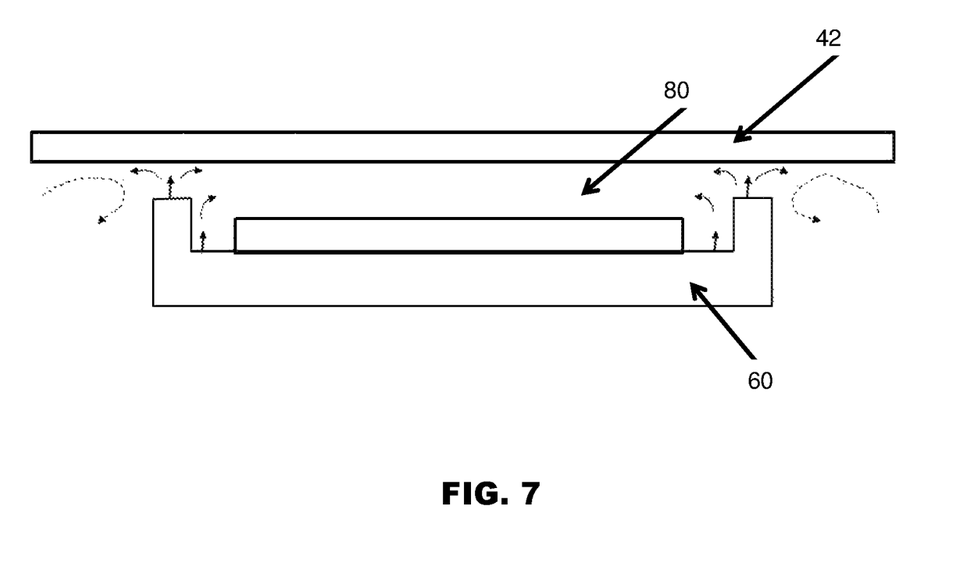
FIG. 7 is a side view of a micro inert environment comprised in the inert environment system.

FIG. 7 is a side view of the micro inert environment 80 comprised in the inert environment system 90. The movable micro inert environment 80 is created when the bond stage 60 moves below the macro inert environment 40. The micro inert environment 80 primarily comprises a portion of the bond stage 60 that is enclosed by the walls 62 on the sides, by the bond stage pedestal 66 on the bottom, and by the macro inert chamber base plate 42 on the top. There is a gap between the bond stage inert gas outlets 64 of the walls 62 and the macro inert chamber base plate 42 of the macro inert environment 40, so that the micro inert environment 80 may freely move below the macro inert environment 40 and relative to the macro inert environment 40 and the core inert environment 50. The outer inert gas outlets 69 expels inert gas towards the macro inert chamber base plate 42 of the macro inert environment 40 to form the shield or air curtain to restrict ambient air from entering the micro inert environment 80. The air curtain, formed by the inert gas flowing from the outer inert gas outlets 69, is designed to restrict gaseous exchange between the micro inert environment 80 and the ambient air. The inert gas from the outer inert gas outlets 69 flows directly to the macro inert chamber base plate 42, and the inert gas flow splits up such that a first portion of the inert gas flow is directed outwards to the ambient air and a second portion of the inert gas flow is directed inwards into the micro inert environment 80. In this manner, the air curtain restricts ambient air from entering into the micro inert environment 80, even when the micro inert environment 80 is moving below the macro inert environment 40.

The micro inert environment 80 serves to protect the substrate 26 from oxidation. The substrate 26 is placed on the bond stage 60 in the ambient air environment, but when the bond stage 60 moves below the macro inert environment 40, the micro inert environment 80 is created. When the micro inert environment 80 is created, the substrate 26 may be heated up safely, because the micro inert environment 80 protects the substrate 26 from oxidation during transportation below the macro inert environment 40, and during bonding.

Figure 8:
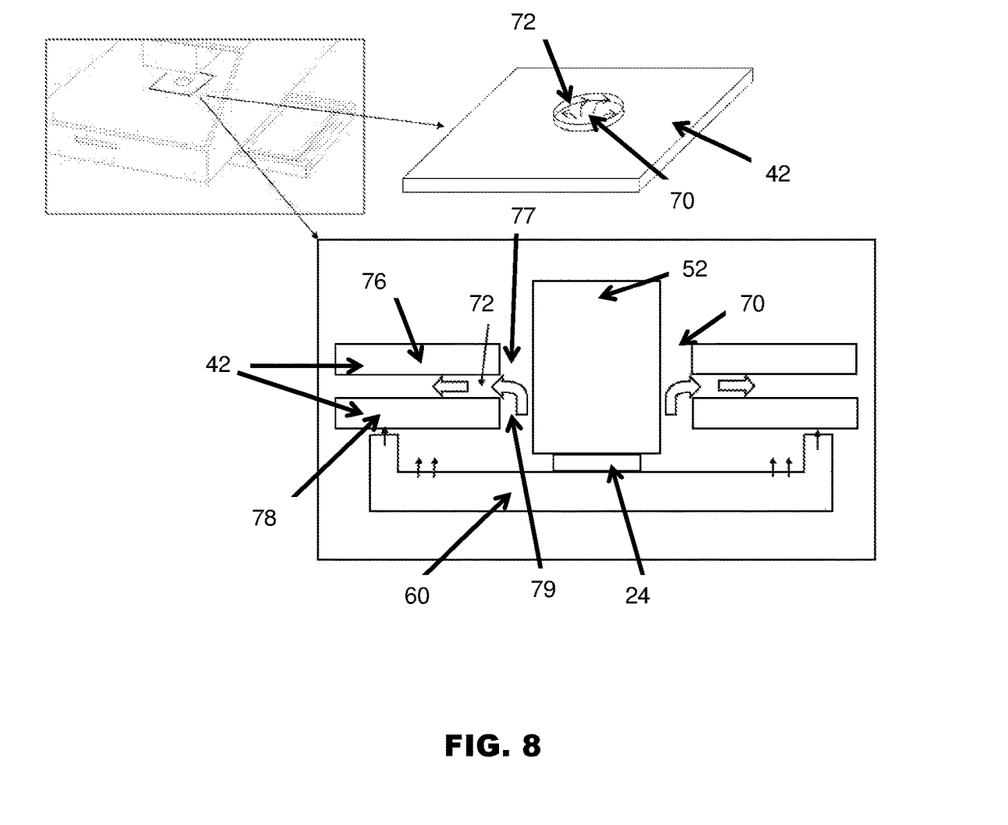
FIG. 8 illustrates a flux exhaust system incorporated in the die bonder.

FIG. 8 illustrates a flux exhaust system incorporated in the die bonder. During bonding, the bond head 52 holding the die 24 heats up the die 24 to an appropriate temperature for bonding, and moves downwards towards the substrate 26 which has been heated up by the bond stage heater 46 to an appropriate temperature for bonding. The bond head 52 moves downwards through the BEW opening 70 and the second container opening 74, until the die 24 contacts the substrate 26. The die 24 is then bonded to the substrate 26 under high temperature, and vaporized flux is generated during bonding. The flux exhaust system comprising a flux exhaust inlet 72, a vapor condenser (not shown) connected to the flux exhaust inlet 72, and a storage collector (not shown) connected to the vapor condenser, is configured to remove the vaporized flux. The macro inert chamber base plate 42 comprises a first plate 76 comprising a first hole 77, and a second plate 78 comprising a second hole 79 aligned with the first hole 77. The first hole 77 and the second hole 79 together forms the BEW opening 70. The flux exhaust inlet 72 is located at the BEW opening 70, and the flux exhaust inlet 72 comprises the space in-between the first plate 76 and the second plate 78. The vaporized flux may enter the flux exhaust inlet 72 from the BEW opening 70 in-between the first plate 76 and the second plate 78. The flux exhaust inlet 72 may for example be circular in shape, such that the vaporized flux enters the circular shaped flux exhaust inlet 72 from all directions. The flux exhaust system produces a suction force to extract the vaporized flux generated during bonding into the flux exhaust inlet 72, and thereafter expels the flux exhaust from the flux exhaust system.

The flux exhaust system is also configured to extract the ambient air when the micro inert environment 80 is not below the BEW opening 70, such that ambient air is prevented from entering into the micro inert environment 80 when the micro inert environment 80 is not below the BEW opening 70. In addition, the flux exhaust system is configured to extract the ambient air in the micro inert environment 80 when the micro inert environment 80 moves below the BEW opening 70. Furthermore, the flux exhaust system may be configured to correlate with inert gas supplies to the micro inert environment 80, such that the ambient air is prevented from entering into the micro inert environment 80 even without the air curtain formed by the inert gas flowing from the outer inert gas outlets 69.

The concentration of oxygen in the macro inert environment 40 may vary widely, but is usually from 50 ppm (parts per million) to 100 ppm. The concentration of oxygen in the core inert environment 50 may also vary widely, but is usually from 0 ppm to 50 ppm. The concentration of oxygen in the micro inert environment 80 may further vary widely, but is usually from 0 ppm to 50 ppm.

Although the present invention has been described in considerable detail with reference to certain embodiments, other embodiments are possible.

For example, instead of the door at the DTA opening 32, an inert gas air curtain may be provided to minimize gaseous exchange between the macro inert environment 40 and the ambient air.

Therefore, the spirit and scope of the appended claims should not be limited to the description of the embodiments contained herein.

The invention claimed is:

1. A die bonding apparatus comprising:
a first inert gas container in the form of a first chamber having a first inert gas concentration;
a second inert gas container in the form of a second chamber having a second inert gas concentration enclosed within the first inert gas container, the second inert gas concentration being higher than the first inert gas concentration;
a bond head located in the second inert gas container for receiving a die for bonding; and
a third inert gas container located outside the first and second chambers, and movable relative to the first inert gas container and the second inert gas container, the third inert gas container having an inert gas environment that is separate from the first and second inert gas containers and where a substrate is locatable for die bonding;
wherein the bond head is operative to move the die between a first position within the second inert gas container and a second position outside the first and second chambers to bond the die onto the substrate located in the third inert gas container.

2. The die bonding apparatus of claim 1, wherein the third inert gas container is located below the first inert gas container.

3. The die bonding apparatus of claim 1, wherein the third inert gas container is mounted on a bond stage.

4. The die bonding apparatus of claim 3, wherein the bond stage comprises walls at a peripheral of the bond stage, and the walls comprise a plurality of inert gas outlets for expelling inert gas towards the first inert gas container to form an air curtain to restrict ambient air from entering the third inert gas container.

5. The die bonding apparatus of claim 4, wherein the bond stage is locatable below the first and second inert gas containers, and there is a gap between the walls of the bond stage and the first inert gas container which allows the bond stage to move relative to the first and second inert gas containers.

6. The die bonding apparatus of claim 3, wherein the bond stage comprises an additional storage space for storing one or more nozzles which are mountable onto the bond head, wherein the additional storage space is adjacent a position where the substrate is locatable for die bonding.

7. The die bonding apparatus of claim 3, wherein the bond stage is movable between a loading position where the substrate is loaded onto the bond stage, and a bonding position where the die is bonded to the substrate.

8. The die bonding apparatus of claim 7, further comprising a transfer arm operative to transport the substrate and to place the substrate onto the bond stage when the bond stage is at the loading position.

9. The die bonding apparatus of claim 1, wherein:
the first inert gas container comprises a first container opening;
the second inert gas container comprises a second container opening; and
the first container opening and the second container opening are aligned to allow the bond head to extend through the respective openings to bond the die to the substrate.

10. The die bonding apparatus of claim 9, further comprising a die transporter operative to transport the die to a pick-up position located in the first inert gas container, wherein the pick-up position is aligned to the first container opening and the second container opening to allow the bond head to move to the pick-up position to pick up the die from the die transporter.

11. The die bonding apparatus of claim 10, further comprising a die transporter opening on a side wall of the first inert gas container, wherein a die transfer arm is operative to extend through the die transporter opening to transfer the die to the die transporter.

12. The die bonding apparatus of claim 9, wherein the first container opening is comprised in a base plate including:
a first plate comprising a first plate hole; and
a second plate spaced from the first plate comprising a second plate hole aligned with the first plate hole, the first and second plate holes together forming the first container opening.

13. The die bonding apparatus of claim 12, further comprising an exhaust inlet connected to the base plate to draw in air from the first container opening in-between the first plate and the second plate.

14. The die bonding apparatus of claim 1, further comprising a second container inert gas inlet connected to the second inert gas container to supply inert gas to the second inert gas container, wherein the first inert gas container receives inert gas from the second container inert gas supply through an overflow from the second inert gas container and there is no inert gas supply directly connected to the first inert gas container.

15. The die bonding apparatus of claim 14, wherein the second inert gas container comprises a plurality of inert gas outlets spaced equally apart to direct a laminar flow around the bond head located within the second inert gas container towards an opening of the second inert gas container.

16. The die bonding apparatus of claim 1, further comprising a transparent window at a side wall of the second inert gas container for allowing a user to look into the second inert gas container.

* * * * *